(12) United States Patent
Loraine et al.

(10) Patent No.: US 7,369,822 B2
(45) Date of Patent: May 6, 2008

(54) SEGMENTED SWITCHING POWER AMPLIFIER

(75) Inventors: Jeremy Loraine, Cottenham (GB); Jeffery Wojtiuk, Willingham (GB); Philip Macphall, Cherry Hinton (GB)

(73) Assignee: SiGe Semiconductor Inc., Ottawa, Ontario (CA)

( * ) Notice: Subject to any disclaimer, the term of this patent is extended or adjusted under 35 U.S.C. 154(b) by 256 days.

(21) Appl. No.: 10/847,609

(22) Filed: May 18, 2004

(65) Prior Publication Data

US 2005/0260956 A1   Nov. 24, 2005

(51) Int. Cl.
*H01Q 1/12*   (2006.01)

(52) U.S. Cl. .................. 455/127.3; 455/114.3; 330/10; 330/295

(58) Field of Classification Search ............ 455/127.3, 455/127.2, 127.1, 114.3; 330/10, 295, 296, 330/297, 96
See application file for complete search history.

(56) References Cited

U.S. PATENT DOCUMENTS

| | | | |
|---|---|---|---|
| 5,264,807 A | 11/1993 | Okubo et al. | |
| 5,365,187 A | 11/1994 | Hornak et al. | |
| 5,901,346 A | 5/1999 | Stengel et al. | |
| 5,990,738 A | 11/1999 | Wright et al. | |
| 6,472,934 B1 | 10/2002 | Pehlke | |
| 6,522,194 B1 | 2/2003 | Pehlke | |
| 6,583,679 B1 | 6/2003 | Soltan | |
| 6,690,233 B2 | 2/2004 | Sander | |
| 6,724,252 B2 * | 4/2004 | Ngo et al. | 330/133 |
| 7,010,276 B2 * | 3/2006 | Sander et al. | 455/108 |
| 2004/0185805 A1 * | 9/2004 | Kim et al. | 455/114.3 |
| 2005/0181746 A1 * | 8/2005 | Wight | 455/91 |

FOREIGN PATENT DOCUMENTS

| | | |
|---|---|---|
| WO | WO 01/99271 A2 | 12/2001 |
| WO | WO 02/50995 A2 | 6/2002 |
| WO | WO 02/075920 A2 | 9/2002 |

OTHER PUBLICATIONS

Asbeck et al., "Synergistic Design of DSP and Power Amplifiers for Wireless Communications", IEEE Transactions on Microwave Theory and Techniques, vol. 49, No. 11, Nov. 2001, pp. 2163-2169.
"The Doherty Amplifier" information booklet, Bell Telephone Laboratories: Western Electric Transmitters, date unknown.
Raab et al., "RF and Microwave Power Amplifier and Transmitter Technologies—Part 3" High Frequency Electronics, Summit Technical Media, LLC, Sep. 2003.

* cited by examiner

*Primary Examiner*—Edward F. Urban
*Assistant Examiner*—Adeel Haroon
(74) *Attorney, Agent, or Firm*—Townsend & Townsend & Crew

(57) ABSTRACT

A novel transmitter circuit is disclosed for receiving of an input signal and for providing of an amplitude increased RF output signal. Pluralities of switching power amplifiers are disposed along two signal propagating circuit branches and utilized for increasing a magnitude of the input signal, to form an output signal, which is a magnitude increased version of the input signal. Each of the switching power amplifiers utilizes switching elements having various magnitude increasing capacity and coupled to a control circuit for each being switchably selectable for providing of the magnitude increase to the input signal.

26 Claims, 5 Drawing Sheets

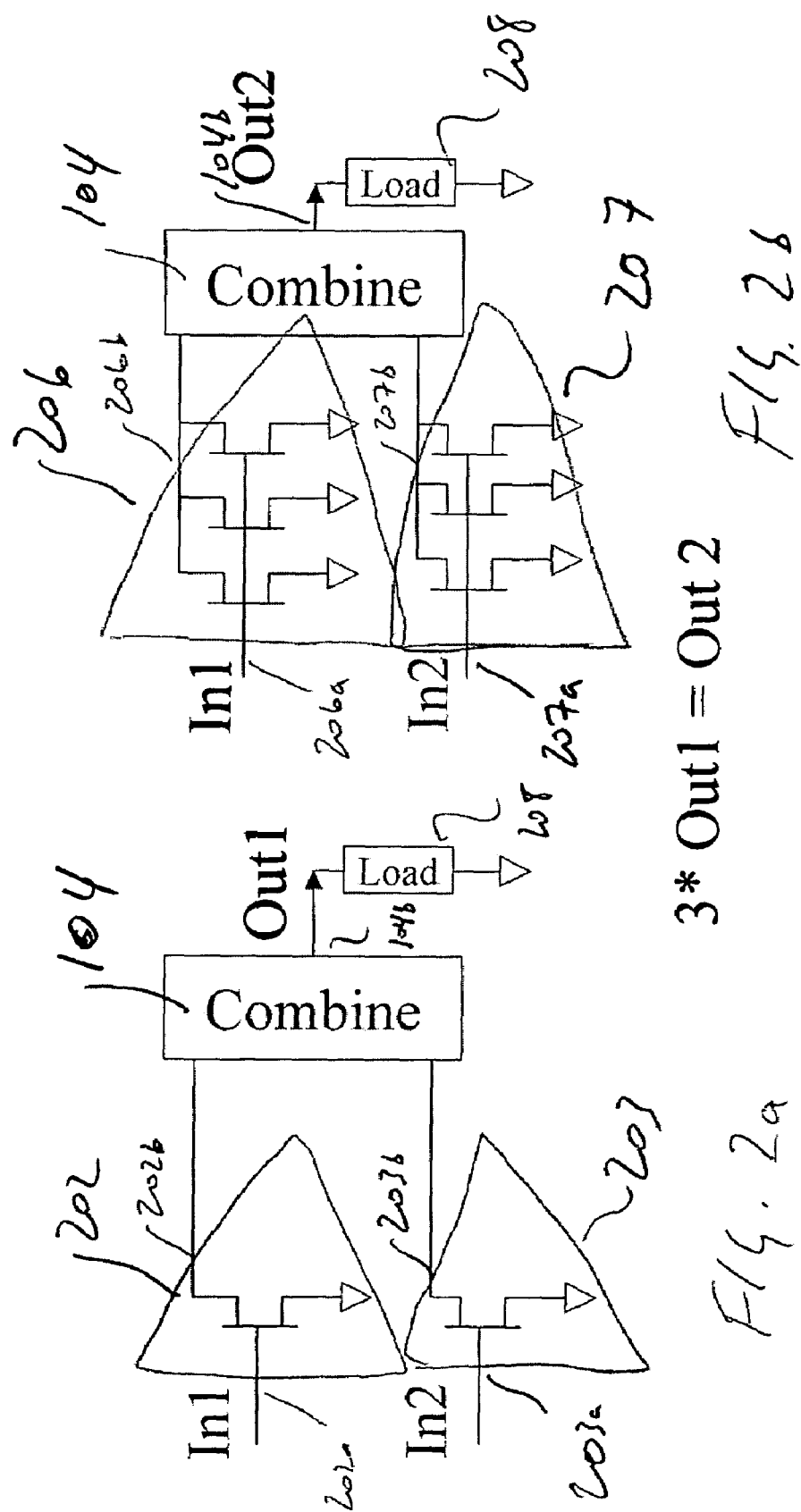

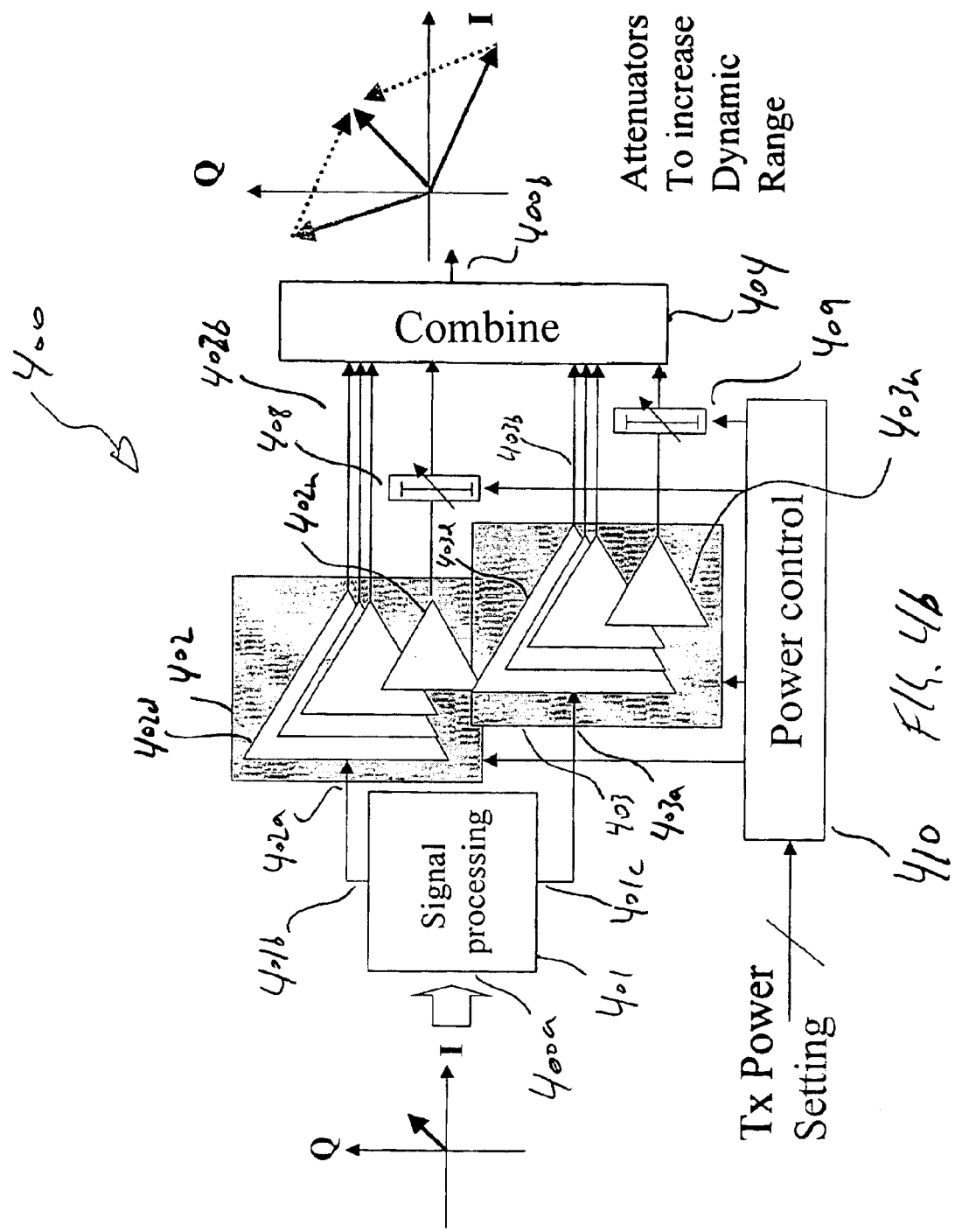

US 7,369,822 B2

SEGMENTED SWITCHING POWER AMPLIFIER

FIELD OF THE INVENTION

The invention relates to the field of power amplifier circuits and more specifically to the field of switching power amplifier circuits.

BACKGROUND OF THE INVENTION

There is a desire to implement power amplifier (PA) circuits for radio frequency (RF) transmitters using CMOS technology having high efficiency and wide dynamic range for both RF power control and complex modulation schemes, such as OFDM and PSK. Ideally, such power amplifiers provide the capacity to generate a signal which includes amplitude modulation having more than 20 dB depth, for OFDM applications, and have the capability to provide over 70 dB of transmit power control, for CDMA applications.

GaAs and other group III-V materials have yet to be integrated into a high density CMOS process (0.18 um) so a single chip solution is not yet available. State of the art CMOS linear power amplifiers do not report high efficiency, primarily due to the high transistor saturation voltage. Thus, this precludes these PAs from being accepted in the market on the grounds they provide significantly reduced battery life for portable devices.

On the other hand, CMOS switched PAs, such as those available from Silicon Laboratories Inc., only operate with constant amplitude envelope signals. Unfortunately, these PAs do not have power control of sufficient range for CDMA applications. Power control for these PAs is achieved by reducing the drain and source terminal voltage (Vds) for the FET used therein. This reduction in Vds provides approximately 30 dB of power control, whereas CDMA and WCDMA applications require in excess of 60 dB power control.

CMOS PAs offer reasonable operating efficiencies when operated in a switched mode of operation, unfortunately, these switched mode PAs are only acceptable for use with RF signals that have a constant amplitude envelope. When CMOS PAs are extended to operate with RF signals having amplitude modulation, they are significantly less efficient than bipolar silicon amplifiers or group III-V material amplifier equivalents. This drop in efficiency is attributable to the high ratio of saturation voltage to maximum operating voltage.

A need therefore exists to provide a PA circuit architecture that uses a CMOS process in a switched amplifier configuration but that is capable of providing an amplitude modulated output signal. In order to provide the amplitude modulated output signal modulation, typically an input signal is split into two or more signals that are thereafter amplified and then combined. Relative phasing of these amplified signals determines both the phase and magnitude of the combined output signal. This type of amplification process is known to those of skill in the art as linear amplification using nonlinear components, or LINC. A LINC amplifier of a radio frequency transmitter provides substantially linear amplification by using two nonlinear amplifier circuits and by decomposing the input signal into two constant amplitude envelope, phase varying signals, which, when combined, constructively and destructively interfere to re-form an amplified version of the original signal For CDMA and WCDMA systems, the power control range is substantially larger than the AM depth required for the modulation, approximately 70 dB and 12 dB, respectively. A LINC type architecture by itself cannot provide gain and phase matching to achieve in excess of 80 dB dynamic range.

It is therefore an object of the invention to provide a PA circuit architecture that is manufactured within a CMOS process and operates using a switched amplifier configuration and offers a large dynamic range.

SUMMARY OF THE INVENTION

In accordance with the invention there is provided a transmitter circuit comprising: a first input port for receiving of a first phase modulated signal at a carrier frequency; a second input port for receiving of a second phase modulated signal at the carrier frequency; a first circuit branch having a first end coupled with the first input port for receiving of the first phase modulated signal; a second circuit branch having a first end coupled with the second input port for receiving of the second phase modulated signal; a first plurality of switching power amplifiers disposed between the first end and second end of the first branch, each for receiving of the first phase modulated signal and each for in a first mode of operation increasing a magnitude of the first phase modulated signal to form, in combination, a first plurality of magnitude increased signals and in a second mode of operation each for other than increasing the magnitude of the first phase modulated signal, wherein the first mode and the second mode for each are switchably selected therebetween; a second plurality of switching power amplifiers disposed between the first end and second end of the second branch, each for receiving of the second phase modulated signal and each for in a first mode of operation increasing a magnitude of the second phase modulated signal to form, in combination, a second plurality of magnitude increased signals, and in a second mode of operation each for other than increasing the magnitude of the second phase modulated signal, wherein the first mode and the second mode for each are switchably selected therebetween; and, a combining circuit comprising an output port and coupled with the second end of the first branch and the second end of the second branch for receiving of the first and second magnitude increased signal and for combining the first and second magnitude increased signal to form a RF output signal.

In accordance with the invention there is provided a circuit comprising: a first input port for receiving of a first phase modulated signal at a carrier frequency; a first circuit branch having first circuit branch portion and a second circuit branch portion, each having a first end coupled with the first input port and a second end; a first plurality of switching power amplifiers comprising: a first switching element having a first switch magnitude disposed along the first branch portion between the first end and second end of the first branch portion for receiving of the first phase modulated signal and for in a first mode of operation increasing a magnitude of the first phase modulated signal to form a first magnitude increased signal for provision from the second end of the first branch portion and in a second mode of operation for other than increasing the magnitude of the first phase modulated signal for provision from the second end of the first branch portion, wherein the first mode and the second mode are switchably selected therebetween; a second switching element having a second switch magnitude that is lower than the first switch magnitude and disposed along the second branch portion between the first end and second end of the second branch portion for receiving of the first phase modulated signal and for in a first mode of operation increasing a magnitude of the first phase modulated signal to form a second magnitude increased signal and in a second mode of operation for other than increasing the magnitude of the first phase modulated signal, wherein the first mode and the second mode are switchably selected therebetween; and, a first attenuator circuit disposed along the second branch portion and coupled between the second switching element and the second end of the second branch portion for in a third mode of operation for receiving of the second magnitude increased signal and for controllably attenuating the second magnitude increased signal to form a second magnitude altered signal for provision from the second end of the second branch portion and in a fourth mode of operation for attenuating the second magnitude increased signal to form a second magnitude altered signal for provision from the second end of the second branch portion.

In accordance with the invention there is provided a method comprising: receiving of a first phase modulated signal at a carrier frequency; receiving of a second phase modulated signal at the carrier frequency; providing a first circuit branch and a second circuit branch; propagating the first phase modulated signal at the carrier frequency along the first branch; propagating the second phase modulated signal at the carrier frequency along the second branch; switchably increasing a magnitude of the first phase modulated signal to form a first magnitude increased signal; switchably increasing a magnitude of the second phase modulated signal to form a second magnitude increased signal; and, combining the first and second magnitude increased signals to form a RF output signal.

In accordance with the invention there is provided a method of achieving dynamic range comprising: receiving of a first phase modulated signal at a carrier frequency; providing a first circuit branch; propagating the first phase modulated signal at the carrier frequency along the first branch; and, at least one of switchably increasing a magnitude of the first phase modulated signal to form a first magnitude increased signal and switchably increasing a magnitude of the first phase modulated signal to form a first magnitude increased signal and controllably attenuating the first magnitude increased signal.

BRIEF DESCRIPTION OF THE DRAWINGS

Exemplary embodiments of the invention will now be described in conjunction with the following drawings, in which:

FIG. 1 illustrates a two-channel implementation of a transmitter circuit 100;

DETAILED DESCRIPTION OF EMBODIMENTS OF THE INVENTION

Figure 2:
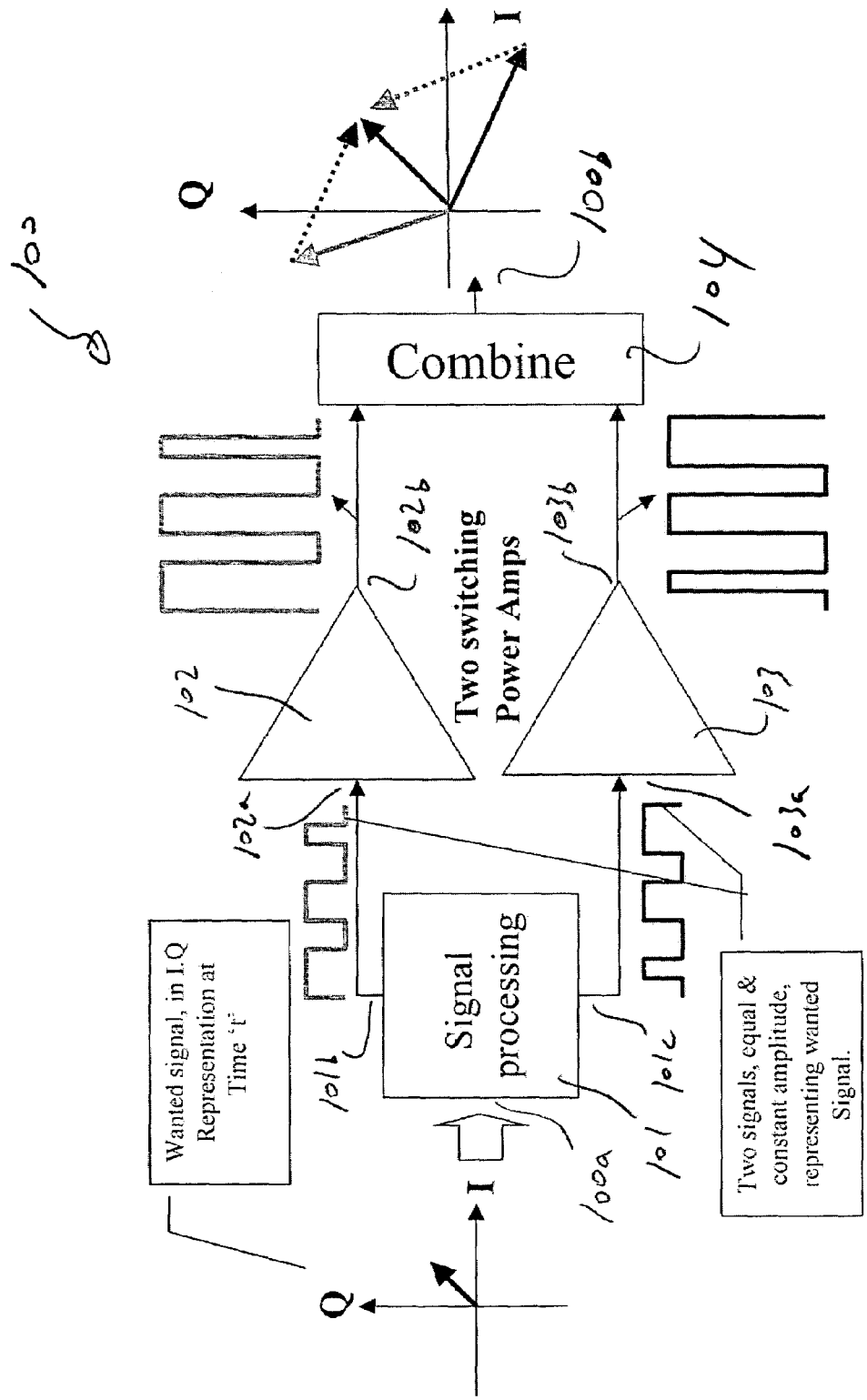
FIGS. 2a and 2b illustrate block diagrams of switching power amplifier circuits (SPAs) used for the transmitter circuit shown in FIG. 1.

FIG. 1 illustrates a two-channel implementation of a transmitter circuit 100. An input signal is provided to an input port 100a. Coupled to the input port is a signal processing circuit 101 that receives the RF input signal and splits this signal into a first signal and a second signal in a predetermined manner. The first and second signals are at a carrier frequency. Both have a constant amplitude modulation envelope and are each phase modulated differently, but both in relation to, the amplitude and phase components of a baseband complex modulation envelope. Thus, the first signal has a first phase modulation at the carrier frequency and the second signal has a second phase modulation, different than the first, at the carrier frequency. The first and second signals are provided from first and second output ports thereof, 101b and 101c.

A first switching power amplifier (SPA) 102, disposed along a first circuit branch, has an input port 102a coupled with the first output port 101b of the processing circuit 101 and a second SPA 103, disposed along a second circuit branch, has an input port 103a coupled with the second output port 101c of the processing circuit 101. The first SPA 102 has a first magnitude and is for providing a first magnitude increased signal at the output port thereof and the second SPA 102 has a second magnitude and is for providing a second magnitude increased signal at the output port thereof. Output ports, 102b and 103b, from each of the SPAs, 102 and 103, are coupled with a combining circuit 104 that combines the first and second magnitude signals and provides a RF output signal from an output port.

FIGS. 2a and 2b illustrate block diagrams of SPA circuits 202, 203, 206 and 207, such as those shown in FIG. 1. Two SPAs, 202 and 203, are shown in FIG. 2a, having input ports, 202a and 203a, for receiving of first and second signals and having output ports, 202b and 203b, for providing of first and second magnitude increased signals to the combining circuit 104, which is for providing of a single output signal containing amplitude and phase from an output port 104b thereof to a load 208 coupled thereto. For a simplest implementation, each SPA circuit 202 and 203 includes a single transistor, preferably in the form of a field effect transistor (FET) device, for providing the magnitude increase for each of the first and second input signals.

FIG. 2b also illustrates two SPAs, 206 and 207 having input ports, 206a and 207a, for receiving of the first and second signals and having output ports, 206b and 206b, for providing of first and second magnitude increased signals to the combining circuit 104 for combining the signals to provide a single output signal in the forms of a RF output signal from an output port 104b thereof, to a load 208 coupled thereto. For a more complex implementation, and for a higher magnitude increase than that shown in FIG. 2a, six transistor devices, in the form of field effect transistor (FET) devices, are utilized for providing the magnitude increase to the first and second input signals. Each of the SPAs has three transistor devices disposed therein for providing the magnitude increase to a received input signal. These additional FET devices result in the RF output signal that has a magnitude increase that is approximately three times higher than that for the circuit shown in FIG. 2a. Of course, the six transistor devices are not necessarily of the same size, different sized transistor devices are preferably provided for each providing of a different magnitude increase.

Figure 3:
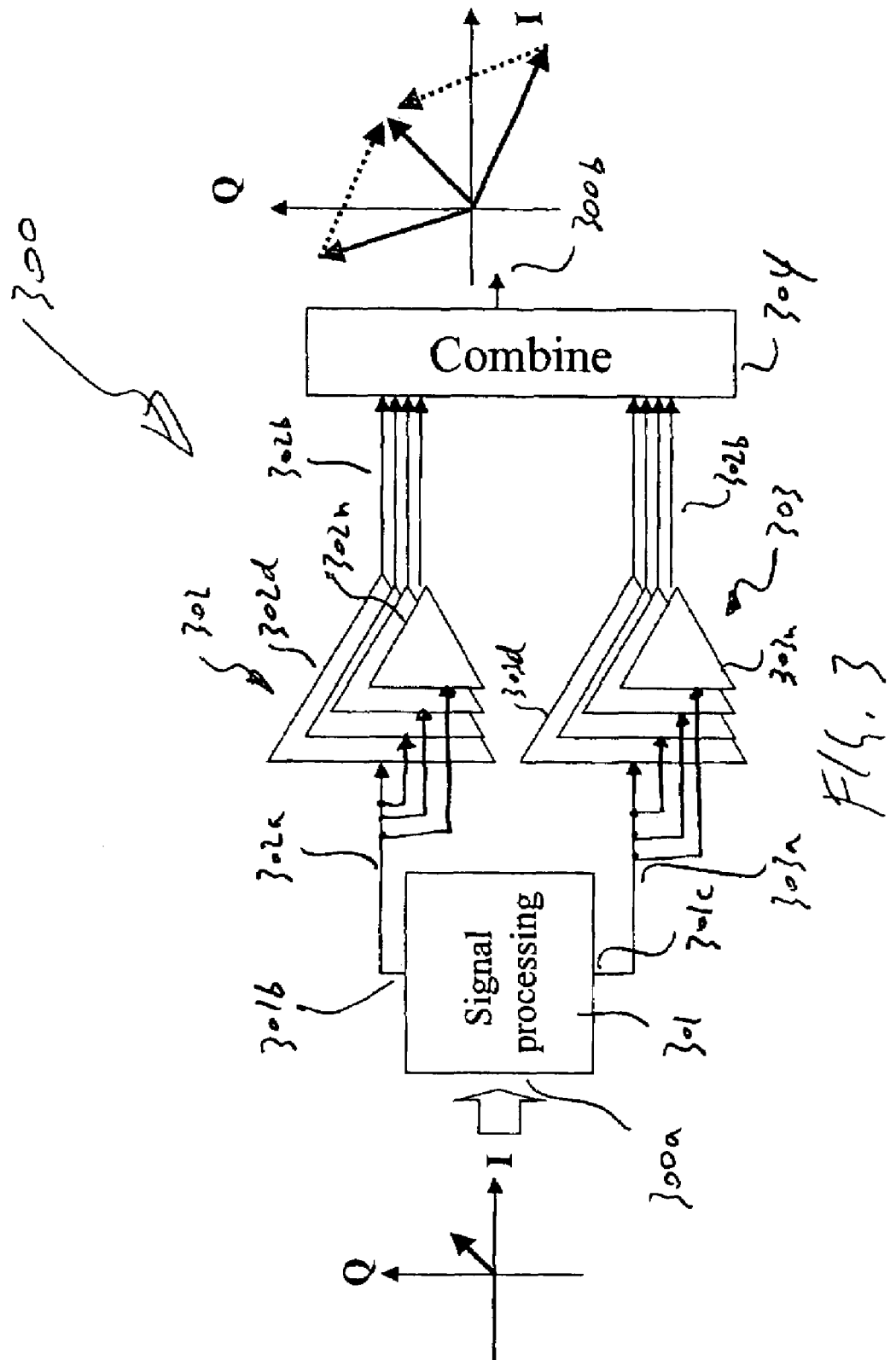
FIG. 3 illustrates a transmitter circuit in accordance with a first embodiment of the invention.

FIG. 3 illustrates a first embodiment of the invention 300, which is a variation of a LINC architecture transmitter circuit. This variation provides a combination of multiple SPAs to allow both amplitude modulation and output signal power control over a wide dynamic range. An input signal is provided to an input port 300a. Coupled to the input port 300a is a signal processing circuit 301 that receives the input signal and splits this signal into first and second signals in a predetermined manner. The first and second signals are at a carrier frequency. Both have a constant amplitude modulation envelope and are each phase modulated differently, but both in relation to, the amplitude and phase components of a baseband complex modulation envelope. Thus, the first signal has a first phase modulation at the carrier frequency and the second signal has a second phase modulation, different than the first, at the carrier frequency. The first and second signals are provided from first and second output ports thereof, 301b and 301c, for propagation along first and second circuit branches. Along the first circuit branch, a first plurality of switching power amplifiers (SPAs) 302 have an input port 302a coupled with the first output port 301b of the processing circuit 301.

The first plurality of SPAs 302 is formed from a first plurality of switching elements, 302d to 302n, where each switching element has an input port thereof coupled with the input port 302a. A plurality of output ports 302b couple each of the first plurality of switching elements, 302d to 302n, to the combining circuit 304, terminating the first circuit branch. The first plurality of SPAs 302 have a combined first magnitude that is used for providing the magnitude increase for the first input signal, thus forming a first plurality of magnitude increased signals.

Along the second circuit branch, a second plurality of SPAs 303 have an input port 303a coupled with the second output port 301b of the processing circuit 301. The second plurality of SPAs 303 is formed from a second plurality of switching elements, 303d to 303n, where each switching element has an input port thereof coupled with the input port 303a. A plurality of output ports 303b couple each of the switching elements, 303d to 303n, to the combining circuit 304, terminating the second circuit branch. The second plurality of SPAs 303 have a combined second magnitude that is used for providing the magnitude increase for the second input signal, thus forming a second plurality of magnitude increased signals.

The combining circuit 304 combines the first and second pluralities of magnitude increased signals using constructive and destructive interference to provide a RF output signal, that is a magnitude increased version of the input signal, from an output port 300b. A total magnitude increase for the transmitter circuit 300 is dependent upon the first and second magnitude increases for the plurality of SPAs, 302 and 303.

Figure 4G:
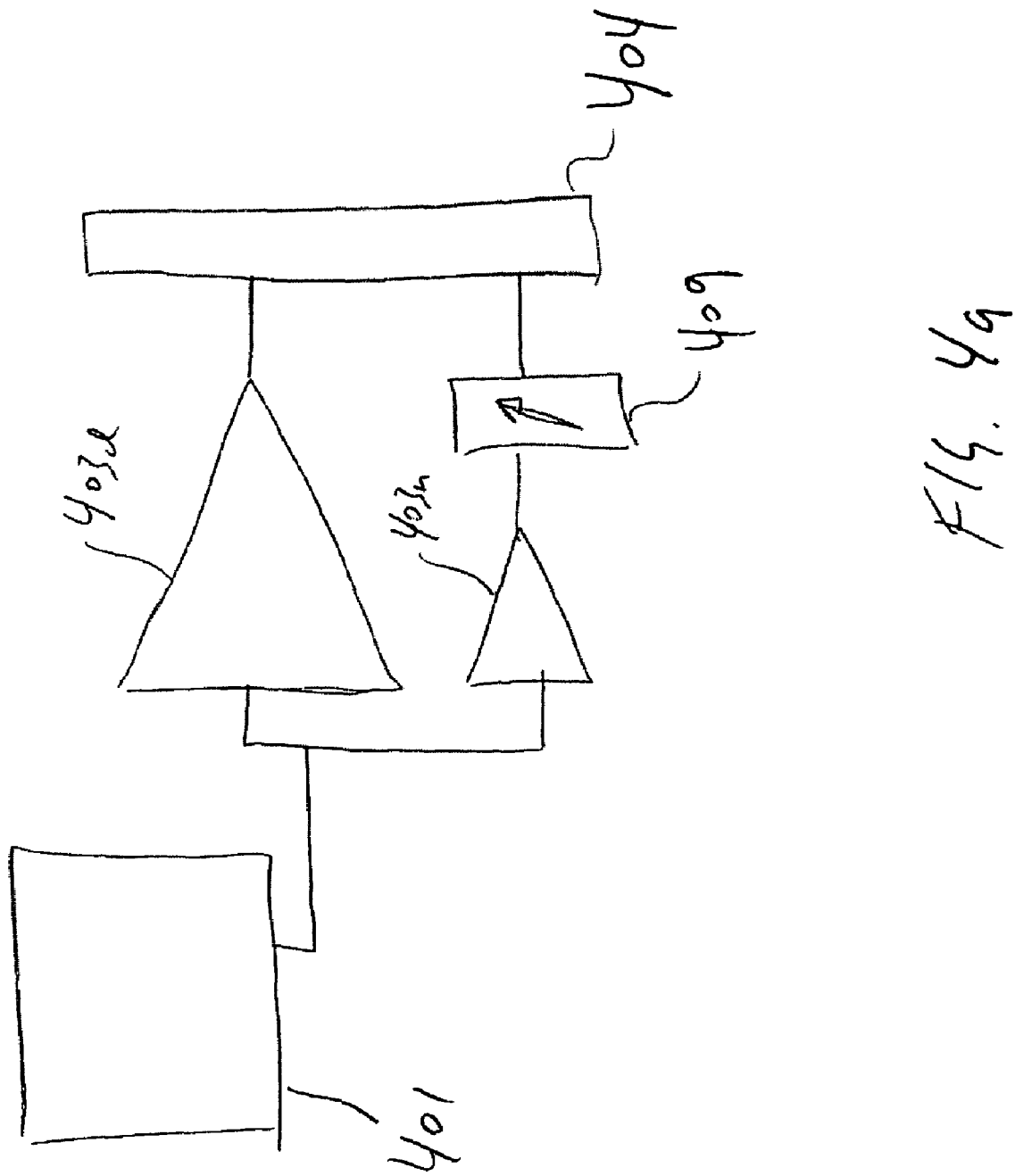
FIG. 4a illustrates a second attenuator device that is coupled in series between a low magnitude switching element and a combining circuit; and, FIG. 4b illustrates a transmitter circuit in accordance with a second embodiment of the invention.

In order to obtain a 70 dB magnitude increase, for example, when using the first and second plurality of SPAs, 302 and 303, a ratio of a low magnitude switching element, 302d through 302n and 303d through 303n, and a high magnitude switching element, 302d through 302n and 303d through 303n, is approximately 1:10,000,000, thus posing a potential problem in the physical size of the switching elements during manufacturing. As is shown in FIG. 4a, this size variation is advantageously overcome by inserting a variable magnitude decreasing stage, in the form of an attenuator, which is coupled to each of the output ports of the SPAs that are used for low signal amplification. The attenuation is used to further reduce signal magnitude for magnitude increased signals that are propagating from those switching elements which have the attenuator coupled thereto.

FIG. 4a illustrates a second attenuator device 409 that is coupled in series between a low magnitude switching element 403n and a combining circuit 404, along a second portion of a second circuit branch for receiving of a second signal from a signal processing circuit 401. A high magnitude switching element 403d is also coupled to the signal processing circuit 401 along a first portion of the second cicuit branch for receiving of the second signal. Each of the switching elements 403d and 403n, as well as the second attenuator device 409, are independently controllable for each providing one of a magnitude increased and magnitude decreased signal to the combining circuit 404.

Of course, the second attenuator device 409 exhibits propagation loss, even when it is set to have zero attenuation. For example, when the second attenuator device 409 has a 1 dB minimum insertion loss, then approximately 17% more signal magnitude is generated in order to overcome this insertion loss. If the second attenuator device 409 is coupled with the output port of the high magnitude switching element 403d (not shown in FIG. 4a), at full magnitude, this switching element 403d consumes, for example, 1000 mA without the second attenuator device 409. Inserting the second attenuator device 409 results in a power consumption of approximately 1170 mA in order to overcome the insertion loss of the second attenuator device 409, which is an addition of 170 mA. However, if the second attenuator device 409 is coupled with the low magnitude switching element 403n (as shown in FIG. 4a), which for example consumes 5 mA, then the current increase for powering of the low magnitude switching element 403n in overcoming the insertion loss of the second attenuator device 409 is 1 mA, as opposed to 170 mA. Thus, it is advantageous in terms of power consumption to couple an attenuator device with a magnitude switching element that has a low magnitude increase in order to increase a dynamic range of a transmitter in which these switching elements are utilized.

FIG. 4b illustrates a transmitter circuit 400 in accordance with a second embodiment of the invention. In this embodiment, first and second controllable attenuators, 408 and 409 are coupled in series with lower magnitude switching elements. An input signal is provided to an input port 400a. Coupled to the input port 400a is a signal processing circuit 401 that receives the input signal and splits this signal into first and second signals in a predetermined manner. The first and second signals are at a carrier frequency. Both have a constant amplitude modulation envelope and are each phase modulated differently, but both in relation to, the amplitude and phase components of a baseband complex modulation envelope. Thus, the first signal has a first phase modulation at the carrier frequency and the second signal has a second phase modulation, different than the first, at the carrier frequency. These first and second signals are provided from first and second output ports thereof, 401b and 401c, for propagation along first and second circuit branches.

Along the first circuit branch, a first plurality of switching power amplifiers (SPAs) 402 have an input port 402a coupled with the first output port 401b of the processing circuit 401. The first plurality of SPAs 402 is formed from individual switching elements, 402d to 402n, where an input port from each of the switching elements is coupled with the input port 402a. A plurality of output ports 402b couple each of the individual switching elements, 402d to 402n, to the combining circuit 404, terminating the first circuit branch. Each of the SPAs, 402d from 402n, preferably provides a different signal magnitude increasing capacity between an input port and an output port thereof. So, for example, switching element 402d provides a higher magnitude output signal than switching element 402n, which provides the lowest magnitude output signal from the first plurality of SPAs 402. A first attenuator circuit 408 is disposed between the switching element 402n and the combining circuit 404 because additional transmit power, in order to overcome first attenuator insertion loss, is minimal when the first attenuator 408 is used with the lowest magnitude switching element 402n. Optionally, additional attenuators are disposed between other switching elements 402d to 402n, from the first plurality of SPAs 402 in dependence upon performance requirements, where preferably these additional attenuators are disposed in series between switching elements which have a lower magnitude increases in order to minimize additional signal amplitude increase in order to overcome the insertion losses of the additional attenuators. So for example, these additional attenuators are disposed in conjunction with switching elements 4021 and 402m.

Along the second circuit branch, a second plurality of switching power amplifiers (SPAs) 403 have an input port 403a coupled with the second output port 401c of the processing circuit 401. The second plurality of SPAs 403 is formed from individual switching elements, 403d to 403n, where an input port from each of the switching elements is coupled with the input port 403a. A plurality of output ports 403b couple each of the individual switching elements, 403d to 403n, to the combining circuit 404, terminating the second circuit branch. Each of the SPAs, 403d from 403n, preferably provides a different signal magnitude increasing capacity between an input port and an output port thereof. So, for example, switching element 403d provides a higher magnitude output signal than switching element 403n, which provides the lowest magnitude output signal from the second plurality of SPAs 403. A second attenuator circuit 408 is disposed between the switching element 403n and the combining circuit 404 because additional transmit power, in order to overcome first attenuator insertion loss, is minimal when the second attenuator 408 is used with the lowest magnitude switching element 403n. Optionally, additional attenuators are disposed between other switching elements 403d to 403n, from the second plurality of SPAs 403 in dependence upon performance requirements, where preferably these additional attenuators are disposed in series between switching elements which have lower magnitude increases in order to minimize additional signal amplitude increase in order to overcome the insertion losses of the additional attenuators. So for example, these additional attenuators are disposed in conjunction with switching elements 4031 and 403m. After input signals to each of the switching elements are provided from the output ports thereof, they are magnitude-increased signals. Thus, a first plurality of magnitude-increased signals is provided from the first plurality of SPAs 402 and a second plurality of magnitude-increased signals is provided from the second plurality of SPAs 403.

The combining circuit 404, which is coupled with the first and second pluralities of output ports, 402b and 403b, receives the first and second pluralities of magnitude increased signals and combines them into a single RF output signal, which is a magnitude increased version of the input signal, for provision to an output port 300b. A control circuit 410 is coupled with each of the first and second pluralities of SPAs, 402 and 403, for in dependently controlling the magnitude increase for each of the switching elements therein.

Thus, the transmitter circuit 400 is provided with at least one input signal, which is the input signal and optionally a level signal indicative of a transmit power for the transmitter circuit 400. The input signal is either in the form of an input signal containing the carrier frequency and modulation information, or the input signal either contains digital information, a modulated RF carrier having with AM and PM components or is a phase modulated carrier with separate amplitude modulation information.

The signal processing circuit 401 splits the input signal into two or more phase modulated signals at a carrier frequency for propagation along at least the first and second circuit branches. The transmitter circuit 400 is not limited to having two circuit branches as shown, optionally additional circuit branches are disposed between the signal processing circuit 401 and the combining circuit 404.

The output power level of the transmitter circuit 400 is influenced by the control circuit 410. This control circuit individually controls each of the switching elements, from the first plurality of SPAs 402 and the second plurality of SPAs 403, in order to provide a predetermined signal magnitude increase or decrease for the transmitter circuit 400. Thus, the control circuit switchably enables each of the switching elements, 402d to 402n and 403d to 403n, in order to provide the predetermined signal magnitude increase or decrease.

For example, the control circuit 410 provides a digital control signal to the first and second pluralities of SPAs, 402 and 403, having a value from 0000 to xxxx, where xxxx determines a magnitude relationship between the input signal to the transmitter circuit 400 and the RF output signal provided from the transmitter circuit 400. A power level of the input signal determines a value for xxxx and hence the number of switching elements that are to be switchably selected for use in magnitude increasing within each of the first and second pluralities of SPAs, 402 and 403.

For transmitting of low RF output signal powers, only switching elements that provide lower signal magnitude increases, for example switching elements 4021 to 402n and 4031 to 403n, are switchably selected for use in providing the magnitude increase. Additionally, the control circuit 410 is coupled with each of the first and second attenuators, 408 and 409, for controlling thereof. The same control signal, having a value from 0000 to xxxx is preferably used for controlling the attenuation of each of the attenuators, 408 and 409. So, for example, a least significant bit (LSB) from the control signal is used for controlling of the first and second attenuators, 408 and 409.

Advantageously, the first and second attenuators, 408 and 409, are easily implemented with an excess of 20 dB in controllable attenuation range, thus advantageously reducing the scaling in transistor size within switching elements, 402d through 402n and 403d through 403n, to a more acceptable value of approximately 1:100,000. With the addition of first and second attenuators, the transmitter circuit 400 allows for operation with amplitude modulated input signals and for providing a high range of RF output signal power.

Advantageously, the transmitter circuits 300 and 400 are can be implemented in a CMOS monolithic circuit, where the transmitter circuits are comprised of multiple CMOS FET amplifying devices. Hence the output power for the transmitter circuit is determined by a number of FET switching elements that are controllably switched into the first and second circuit branches. By selecting the number of FET switching elements that are switched in, the output power for the transmitter circuits is controlled. Optionally, the transmitter circuits 300 and 400 are standalone ICs that incorporate only the transmitter portion, or integrated within a complete transceiver IC. Preferably the transmitter circuits are integrated into a CMOS substrate using a 0.18 u technology.

Numerous other embodiments may be envisaged without departing from the spirit or scope of the invention.

What is claimed is:

1. A transmitter circuit comprising:
a first input port for receiving of a first phase modulated signal at a carrier frequency;

a second input port for receiving of a second phase modulated signal at the carrier frequency;

a first circuit branch having a first end coupled with the first input port for receiving of the first phase modulated signal;

a second circuit branch having a first end coupled with the second input port for receiving of the second phase modulated signal;

a first plurality of switching power amplifiers disposed between the first end and second end of the first branch, each for receiving of the first phase modulated signal and each for in a first mode of operation increasing a magnitude of the first phase modulated signal to form, in combination, a first plurality of magnitude increased signals and in a second mode of operation each for other than increasing the magnitude of the first phase modulated signal, wherein the first mode and the second mode for each are switchably selected therebetween;

a second plurality of switching power amplifiers disposed between the first end and second end of the second branch, each for receiving of the second phase modulated signal and each for in a first mode of operation increasing a magnitude of the second phase modulated signal to form, in combination, a second plurality of magnitude increased signals, and in a second mode of operation each for other than increasing the magnitude of the second phase modulated signal, wherein the first mode and the second mode for each are switchably selected therebetween; and, a combining circuit comprising an output port and coupled with the second end of the first branch and the second end of the second branch for receiving of the first and second magnitude increased signal and for combining the first and second magnitude increased signal to form a RF output signal.

2. A transmitter circuit according to claim 1 comprising:
a signal processing circuit, wherein the signal processing circuit comprises:
a first output port coupled with the first input port;
a second output port coupled with the second input port;
at least an input port for receiving one of an input signal containing the carrier frequency and modulation information and a plurality of input signals containing the carrier frequency and modulation information and for providing the first phase modulated signal at the carrier frequency to the first output port and for providing the second phase modulated signal at the carrier frequency to the second output port.

3. A transmitter circuit according to claim 1 comprising:
a first attenuator circuit coupled between one of the first plurality of switching power amplifiers and the combining circuit; and,
a second attenuator circuit coupled between one of the second plurality of switching power amplifiers and the combining circuit.

4. A transmitter circuit according to claim 1 wherein the first plurality of switching power amplifiers comprises a first plurality of switching elements that have a first plurality of different switch magnitudes, wherein each of the switching elements from the first plurality are disposed in parallel and are independently switchably selectable for contributing signal magnitude to the first magnitude increased signal.

5. A transmitter circuit according to claim 4 comprising a first attenuator circuit coupled with an output port of a switching elements from the first plurality of switching elements that has other than a highest switch magnitude.

6. A transmitter circuit according to claim 4 wherein the first plurality of switching elements comprise transistors, wherein the switching elements having a higher switch magnitude comprise at least one of an increased number of transistors and a larger transistor area than those switching elements having a lower switch magnitude.

7. A transmitter circuit according to claim 1 wherein the second plurality of switching power amplifiers comprises a second plurality of switching elements that have a second plurality of different switch magnitudes, wherein each of the switching elements from the second plurality are disposed in parallel and independently switchably selectable for contributing signal magnitude to the first magnitude increased signal.

8. A transmitter circuit according to claim 7 comprising a second attenuator circuit coupled with a switching elements from the second plurality of switching elements that has other than a highest switch magnitude.

9. A transmitter circuit according to claim 8 wherein the amplifying devices within the second plurality of switching elements comprise transistors, wherein the switching elements having a higher switching magnitude comprise at least one of an increased number of transistors and a larger transistor area than those switching elements having a lower gain.

10. A transmitter circuit according to claim 1 comprising a CMOS semiconductor substrate, wherein the transmitter circuit is integrated within the CMOS semiconductor substrate.

11. A transmitter circuit according to claim 1 wherein each of the first and second pluralities of switching power amplifiers comprise switching elements, wherein the transmitter circuit comprising a control circuit coupled to each of the switching elements for switchably selecting operation thereof between the first and second modes of operation.

12. A circuit comprising:
a first input port for receiving of a first phase modulated signal at a carrier frequency;
a first circuit branch having first circuit branch portion and a second circuit branch portion, each having a first end coupled with the first input port and a second end;
a first plurality of switching power amplifiers comprising:
a first switching element having a first switch magnitude disposed along the first branch portion between the first end and second end of the first branch portion for receiving of the first phase modulated signal and for in a first mode of operation increasing a magnitude of the first phase modulated signal to form a first magnitude increased signal for provision from the second end of the first branch portion and in a second mode of operation for other than increasing the magnitude of the first phase modulated signal for provision from the second end of the first branch portion, wherein the first mode and the second mode are switchably selected therebetween;
a second switching element having a second switch magnitude that is lower than the first switch magnitude and disposed along the second branch portion between the first end and second end of the second branch portion for receiving of the first phase modulated signal and for in a first mode of operation increasing a magnitude of the first phase modulated signal to form a second magnitude increased signal and in a second mode of operation for other than increasing the magnitude of the first phase modulated signal, wherein the first mode and the second mode are switchably selected therebetween; and, a first attenuator circuit disposed along the second branch portion and coupled between the second switching element and the second end of the second branch portion for in a third mode of operation for receiving of the second magnitude increased signal and for controllably attenuating the second magnitude increased signal to form a second magnitude altered signal for provision from the second end of the second branch portion and in a fourth mode of operation for attenuating the second magnitude increased signal to form a second magnitude altered signal for provision from the second end of the second branch portion.

13. A circuit according to claim 12 comprising:

a second input port for receiving of a second phase modulated signal at a carrier frequency;

a second circuit branch having a third circuit branch portion and a fourth circuit branch portion, each having a first end coupled with the second input port and a second end;

a second plurality of switching power amplifiers comprising:

a third switching element having a third switch magnitude disposed along the third branch portion between the first end and second end of the third branch portion for receiving of the second phase modulated signal and for in a first mode of operation increasing a magnitude of the second phase modulated signal to form a third magnitude increased signal for provision from the second end of the third branch portion and in a second mode of operation for other than increasing the magnitude of the first phase modulated signal for provision from the second end of the third branch portion, wherein the first mode and the second mode are switchably selected therebetween;

a fourth switching element having a fourth switch magnitude that is lower than the third switch magnitude and disposed along the fourth branch portion between the first end and second end of the fourth branch portion for receiving of the second phase modulated signal and for in a first mode of operation increasing a magnitude of the second phase modulated signal to form a fourth magnitude increased signal and in a second mode of operation for other than increasing the magnitude of the second phase modulated signal, wherein the first mode and the second mode are switchably selected therebetween; and, a second attenuator circuit disposed along the fourth branch portion and coupled between the fourth switching element and the second end of the fourth branch portion for in a third mode of operation for receiving of the fourth magnitude increased signal and for controllably attenuating the fourth magnitude increased signal to provide a fourth magnitude altered signal for provision from the second end of the fourth branch portion and in a fourth mode of operation for attenuating the fourth magnitude increased signal to form the fourth magnitude altered signal for provision from the second end of the fourth branch portion.

14. A circuit according to claim 13 comprising:

a combining circuit comprising an output port and coupled with the second end of the first branch portion, second branch portion, third branch portion and fourth branch portion for receiving of the first through fourth magnitude increased signals and for combining these signals to form a RF output signal.

15. A circuit according to claim 14 comprising:

a signal processing circuit, wherein the signal processing circuit comprises:

a first output port coupled with the first input port;

a second output port coupled with the second input port;

at least an input port for receiving one of an input signal containing the carrier frequency and modulation information and a plurality of input signals containing the carrier frequency and modulation information and for providing the first phase modulated signal at the carrier frequency to the first output port and for providing the second phase modulated signal at the carrier frequency to the second output port.

16. A circuit according to claim 12 wherein the switching elements comprise transistors.

17. A method comprising:

receiving of a first phase modulated signal at a carrier frequency;

receiving of a second phase modulated signal at the carrier frequency;

providing the first phase modulated signal to a first circuit branch, the first circuit branch comprising a first plurality of switching power amplifiers disposed between a first end of the first circuit branch and a second end of the first circuit branch, each for receiving the first phase modulated signal and each for in a first mode of operation increasing a magnitude of the first phase modulated signal to form, in combination, a first plurality of magnitude increased signals and in a second mode of operation each for other than increasing the magnitude of the first phase modulated signal, wherein the first mode and second mode are each for switchably selecting therebetween;

providing the second phase modulated signal to a second circuit branch, the second circuit branch comprising a second plurality of switching power amplifiers disposed between a first end of the second circuit branch and a second end of the second circuit branch, each for receiving a phase modulated signal and each for in a first mode of operation increasing a magnitude of the second phase modulated signal to form, in combination, a second plurality of magnitude increased signals and in a second mode of operation each for other than increasing the magnitude of the phase modulated signal, wherein the first mode and second mode are each for switchably selecting therebetween;

switchably increasing the magnitude of the first phase modulated signal to form the first magnitude increased signal;

switchably increasing the magnitude of the second phase modulated signal to form the second magnitude increased signal; and, combining the first and second magnitude increased signals to form a RF output signal;

wherein, switchably increasing the magnitude, of at least one of the first phase modulated signal and second phase modulated signal comprises switchably increasing independent of the other of the first phase modulated signal and second phase modulated signal.

18. A method according to claim 17 wherein at least one of the first plurality of switching power amplifiers that has other than a highest signal increasing magnitude is operated in conjunction with a first attenuating circuit to form the first magnitude increased signal.

19. A method according to claim 18 wherein at least one of the second plurality of switching power amplifiers that has other than a highest signal increasing magnitude is operated in conjunction with a second attenuating circuit to form the second magnitude increased signal.

20. A method according to claim 19 wherein the switchable increasing comprises switchably controlling the magnitude of the first and second signals to form the first and second magnitude increased signals in dependence upon a power of the input signal.

21. A method according to claim 17 wherein combining comprises summing the first and second magnitude increased signals using constructive and destructive interference to form the RE output signal.

22. A method according to claim 17 comprising:
receiving one of an input signal containing the carrier frequency and modulation information and a plurality of input signals containing the carrier frequency and modulation information; and,
processing the received one of an input signal containing the carrier frequency and modulation information and a plurality of input signals containing the carrier frequency and modulation information to provide the first phase modulated signal at the carrier frequency and the second phase modulated signal at the carrier frequency.

23. A method of achieving dynamic range comprising:
receiving of a first phase modulated signal at a carrier frequency;
providing a first circuit branch comprising at least a first plurality of switching power amplifiers disposed between a first end of the first circuit branch and a second end of the first circuit branch, each for receiving the first phase modulated signal and each for in a first mode of operation increasing a magnitude of the first phase modulated signal to form, in combination, a first plurality of magnitude increased signals and in a second mode of operation each for other than increasing the magnitude of the first phase modulated signal, wherein the first mode and second mode are each for switchably selecting therebetween;
propagating the first phase modulated signal at the carrier frequency along the first branch; and,
at least one of switchably increasing a magnitude of the first phase modulated signal to form a first magnitude increased signal, and switchably increasing a magnitude of the first phase modulated signal to form a first magnitude increased signal and controllably attenuating the first magnitude increased signal.

24. A method according to claim 23 comprising:
receiving of a second phase modulated signal at the carrier frequency;
providing a second circuit branch comprising at least a second plurality of switching power amplifiers disposed between a first end of the second circuit branch and a second end of the second circuit branch, each for receiving a phase modulated signal and each for in a first mode of operation increasing a magnitude of the phase modulated signal to form, in combination, a second plurality of magnitude increased signals and in a second mode of operation each for other than increasing the magnitude of the phase modulated signal, wherein the first mode and second mode are each for switchably selecting therebetween;
propagating the second phase modulated signal at the carrier frequency along the second circuit branch;
switchably increasing a magnitude of the second phase modulated signal to form a second magnitude increased signal; and,
combining the first and second magnitude increased signals to form RF output signal.

25. A method according to claim 24 wherein the switchable increase in the magnitude of the second phase modulated signal is higher than the switchable increase in the magnitude of the first phase modulated signal.

26. A method according to claim 24 comprising:
receiving one of an input signal containing the carrier frequency and modulation information and a plurality of input signals containing the carrier frequency and modulation information; and,
processing the received one of an input signal containing the carrier frequency and modulation information and a plurality of input signals containing the carrier frequency and modulation information to provide the first phase modulated signal at the carrier frequency and the second phase modulated signal at the carrier frequency.

* * * * *